(12) United States Patent
Molina et al.

(10) Patent No.: US 10,601,434 B1
(45) Date of Patent: Mar. 24, 2020

(54) APPARATUS FOR CALIBRATING A TIME-INTERLEAVED ANALOG-TO-DIGITAL CONVERTER

(71) Applicant: Intel Corporation, Santa Clara, CA (US)

(72) Inventors: Albert Molina, Novelda (ES); Kameran Azadet, San Ramon, CA (US); Matteo Camponeschi, Villach (AT); Jose Luis Ceballos, Villach (AT); Christian Lindholm, Villach (AT); Hundo Shin, Santa Clara, CA (US); Martin Clara, Santa Clara, CA (US)

(73) Assignee: Intel Corporation, Santa Clara ( * ) Notice: Subject to any disclaimer, the term of this patent is extended or adjusted under 35 U.S.C. 154(b) by 0 days.

(21) Appl. No.: 16/369,237

(22) Filed: Mar. 29, 2019

(51) Int. Cl.
*H03M 1/10* (2006.01)
*H04B 1/16* (2006.01)
*H04W 88/08* (2009.01)

(52) U.S. Cl.
CPC ............ *H03M 1/1009* (2013.01); *H04B 1/16* (2013.01); *H04W 88/08* (2013.01)

(58) Field of Classification Search
CPC ...... H03M 1/121; H03M 1/1009; H03M 1/10; H03M 1/12; H03M 1/00; H03M 13/27
See application file for complete search history.

(56) References Cited

U.S. PATENT DOCUMENTS

| 9,219,493 B1 * | 12/2015 | Kunnen | ................ H03M 3/496 |
| 2008/0024338 A1 * | 1/2008 | Huang | ................ H03M 1/1028 341/120 |

* cited by examiner

*Primary Examiner* — Keith Ferguson
(74) *Attorney, Agent, or Firm* — 2SPL Patent Attorneys PartG mbB; Kieran O'Leary

(57) ABSTRACT

An apparatus for calibrating a time-interleaved analog-to-digital converter including a plurality of time-interleaved analog-to-digital converter circuits is provided. The apparatus includes an analog signal generation circuit configured to generate an analog calibration signal based on a digital calibration signal representing one or more digital data sequences for calibration. The analog calibration signal is a wideband signal. Further, the apparatus includes a coupling circuit configured to controllably couple an input node of the time-interleaved analog-to-digital converter to either the analog signal generation circuit or to a node capable of providing an analog signal for digitization.

25 Claims, 5 Drawing Sheets

APPARATUS FOR CALIBRATING A TIME-INTERLEAVED ANALOG-TO-DIGITAL CONVERTER

FIELD

The present disclosure relates to analog-to-digital conversion. In particular, examples relate to an apparatus for calibrating a Time-Interleaved Analog-to-Digital Converter (TI-ADC), a receiver, a base station and a mobile device.

BACKGROUND

A TI-ADC employs several lower speed sub-ADCs operating in parallel in order to achieve a desired aggregate sampling rate. Thus, each sub-ADC may operate at a lower speed compared to when a single ADC would be used. Differences amongst sub-ADCs (e.g. caused by manufacturing tolerances) result in degraded performance in terms of noise Power Spectral Density (nPSD) and/or Spurious Free Dynamic Range (SFDR). Typical mismatches amongst the sub-ADCs include: DC offset, gain, timing skew/mismatch, frequency response and other nonlinear mismatches. The combined mismatches may be understood as a single time-variant nonlinear system with memory that degrades the performance of the TI-ADC in terms of nPSD and/or SFDR. Calibration is required in order to remove these undesired performance-degrading effects.

Hence, there may be a desire for a calibration architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
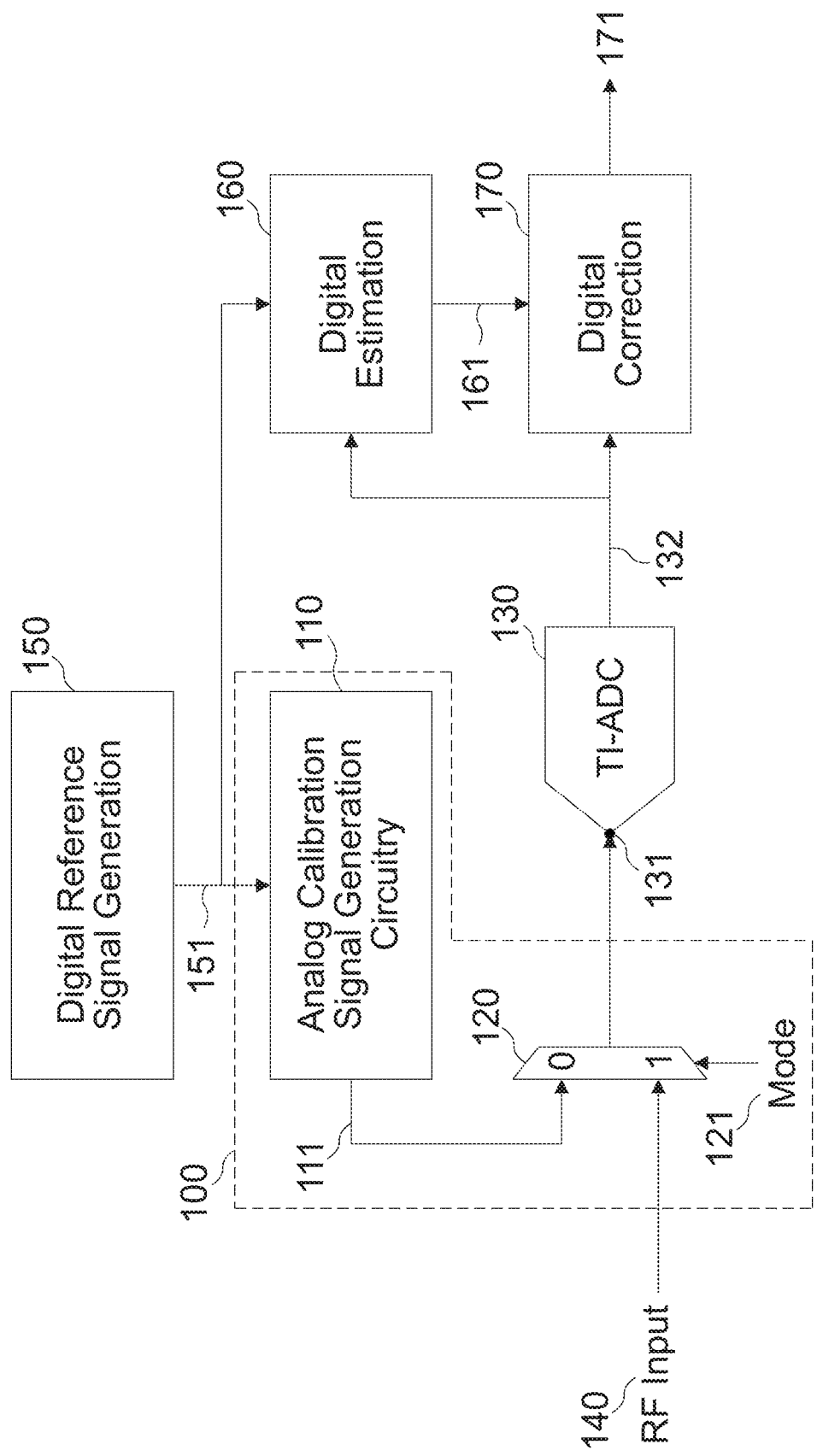
FIG. 1 illustrates an exemplary apparatus for calibrating a TI-ADC.

FIG. 1 illustrates an example of an apparatus 100 for calibrating a TI-ADC 130. The TI-ADC 130 comprises a plurality of time-interleaved ADC circuits. The plurality of time-interleaved ADC circuits may be any number N≥2 of time-interleaved ADC circuits (e.g. related to a desired total/aggregate sample rate of the TI-ADC 130). The time-interleaved ADC circuits of the TI-ADC 130 may be understood as ADC channels or sub-ADCs of the TI-ADC 130. An ADC circuit of the TI-ADC 130 may, e.g., be a Successive Approximation Register (SAR) ADC, a flash ADC (also referred to as direct conversion ADC), a pipeline ADC, a sigma-delta ADC or a time-interleaved ADC itself. If an ADC circuit is a time-interleaved ADC itself, it may comprise at least two sub-ADC circuits. A sub-ADC circuit may, e.g., be a SAR ADC, a flash ADC, a pipeline ADC or a sigma-delta ADC.

The apparatus 100 comprises an analog signal generation circuit 110 configured to generate an analog calibration signal 111 based on a digital calibration signal 151 representing one or more digital data sequences for calibration. As illustrated in FIG. 1, the digital calibration signal 151 representing one or more digital data sequences for calibration may be supplied to the analog signal generation circuit 110 by a digital calibration circuit 150 (e.g. a Digital Signal Processor, DSP) configured to generate the digital calibration signal 151. For example, the analog signal generation circuit 110 may comprise a one or more Digital-to-Analog Converters (DACs), one or more filters, etc. for generating the analog calibration signal 111 based on the digital calibration signal 151. A linearity of the analog signal generation circuit 110 may be higher than a desired (target) linearity of the TI-ADC 130 after calibration.

The analog calibration signal 111 is a wideband signal, i.e. a signal exhibiting a wide bandwidth. For example, a bandwidth of the analog calibration signal 111 may be less than half of a maximum value of the sample rate of the TI-ADC 130. In other words, the analog calibration signal 111 may be bandlimited to half of the sample rate of the TI-ADC 130 in accordance with the Nyquist-Shannon sampling theorem. Further, amplitude values of the analog calibration signal 111 may cover all input amplitude values supported by the TI-ADC 130. That is, the analog calibration signal 111 may cover the whole input amplitude range of the TI-ADC 130. The analog calibration signal 111 may enable to fully characterize the TI-ADC mismatches as a time-variant nonlinear system and, hence, allow to calibrate the TI-ADC 130.

Additionally, the apparatus 100 comprises a coupling circuit 120 configured to operably couple an input node 131 of the TI-ADC 130 to either the analog signal generation circuit 110 or to a signal node 140 capable of providing an analog signal for digitization. For example, the coupling circuit 120 may be configured to controllably couple the input node 131 of the TI-ADC 130 to either the analog signal generation circuit 110 or to the signal node 140 based on a control signal 12. The control signal is indicative of the presently desired one of predetermined operation modes of the TI-ADC 130. A first predetermined operation mode may be a calibration mode. If the TI-ADC 130 is to be calibrated (i.e. the TI-ADC 130 operates in a calibration mode), the coupling circuit 120 may couple the input node 131 of the TI-ADC 130 to the analog signal generation circuit 110 so that the analog calibration signal 111 is supplied as input to the TI-ADC 130. A second predetermined operation mode may be a normal operation mode of the TI-ADC 130 to digitize analog data. If the TI-ADC 130 is to digitize an analog signal such as an analog Radio Frequency (RF) signal carrying user data (i.e. the TI-ADC 130 operates in a regular/normal operation mode), the coupling circuit 120 may couple the input node 131 of the TI-ADC 130 to the signal node 140 so that the analog signal is supplied as input to the TI-ADC 130. For example, the coupling circuit 120 may be implemented using one or more switches (e.g. analog switches such as Metal-Oxide-Semiconductor, MOS, transistors) or one or more (programmable) attenuators (e.g. attenuating the analog calibration signal 111 if the TI-ADC 130 is to digitize an analog signal provided by the signal node 140, and vice versa).

In the normal operation mode, the analog signal of the node 140 is input to the TI-ADC 130 and digitized such that the TI-ADC 130 provides a digital signal 132 at its output. An output circuit 170 receives the digital signal 132 and generates a digital output signal 171 based on the digital signal 132 using correction parameters 161 for correcting impairments and mismatches of the TI-ADC 130.

In the calibration mode, the analog calibration signal 111 is fed to the TI-ADC 130. A parameter determination circuit 160 receives the digital signal 132 output by the TI-ADC 130 and the digital calibration signal 151 as a reference. The parameter determination circuit 160 determines (computes) the correction parameters 161 for correcting the impairments and mismatches of the TI-ADC 130 based on the digital signal 132 output by the TI-ADC 130 and the digital calibration signal 151.

The apparatus 100 may allow selective offline calibration of the TI-ADC 130 by selective coupling the input of the TI-ADC 130 to either the analog signal generation circuit 110 or to the signal node 140. The apparatus 100 may enable simple generation of a linear bandlimited and wideband analog calibration signal 111 for calibration of the TI-ADC 130. The wideband analog calibration signal 111 may allow to calibrate the TI-ADC 130. The generation of the analog calibration signal 111 will be described below in detail with reference to FIGS. 2 to 4.

Figure 2:
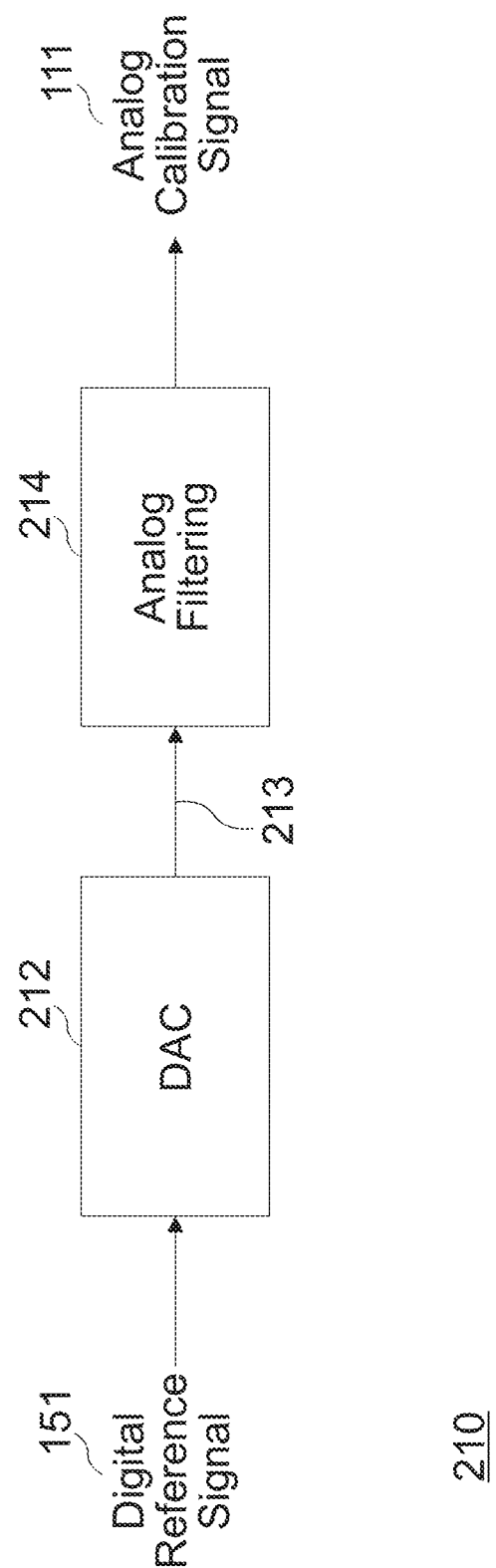
FIGS. 2 to 4 illustrates various examples of analog signal generation circuits.

FIG. 2 illustrates a more detailed example of an analog signal generation circuit 210. The analog signal generation circuit 210 comprises a DAC 212 configured to generate an analog signal 213 based on the digital calibration signal 151 representing the one or more digital data sequences for calibration. Further, the analog signal generation circuit 210 comprises an analog filter 214 configured to generate the analog calibration signal 111 by filtering the analog signal 213 generated by the DAC 212.

The analog signal generation circuit 210 illustrated in FIG. 2 may be understood as a basic architecture (mechanism) for generating a linear and wideband and calibration signal 111 for calibrating a TI-ADC.

The analog filter 214 may comprise one or more analog sub-circuits for filtering the analog signal 213 generated by the DAC 212 and, hence, generating the analog calibration signal 111. For example, the analog filter 214 may filter the analog signal 213 such that the resulting analog calibration signal 111 is bandlimited to less than half of the sample rate of the TI-ADC. The analog filter 214 may, e.g., comprise an analog Finite Impulse Response (FIR) filter (not illustrated in FIG. 2) configured to generate an auxiliary analog signal by filtering the analog signal 213 together with a passive analog filter (not illustrated in FIG. 2) that is coupled to the analog FIR filter and configured to generate the analog calibration signal 111 by filtering the auxiliary analog signal.

Regarding the DAC 212, a DAC exhibiting a high resolution and operating at a high sample rate would simplify the analog filtering requirements. However, realizing a high linearity for such a multi-level DAC is costly. Further, for very high speed DACs (e.g. at a 16 GHz sample rate), oversampling may only be possible by time-interleaving several DACs. However, the time-interleaved DACs may also suffer from mismatches.

For reasons of simplicity and efficiency, the DAC 212 may, at least in some examples, exhibit a resolution of 1 bit. A DAC with 1 bit resolution is inherently linear so that the analog signal generation circuit 210 may exhibit high linearity. Similarly, the one or more digital data sequences represented by the digital calibration signal 151 may be 1 bit sequences.

The thus generated wideband analog calibration signal 111 may allow to jointly correct for all TI-ADC impairments and mismatches listed above such that an optimum performance TI-ADC calibration may be achieved. The proposed architecture for the analog signal generation circuit 210 may allow to generate a highly linear and wideband analog calibration signal 111 in a facilitated manner.

Figure 3:
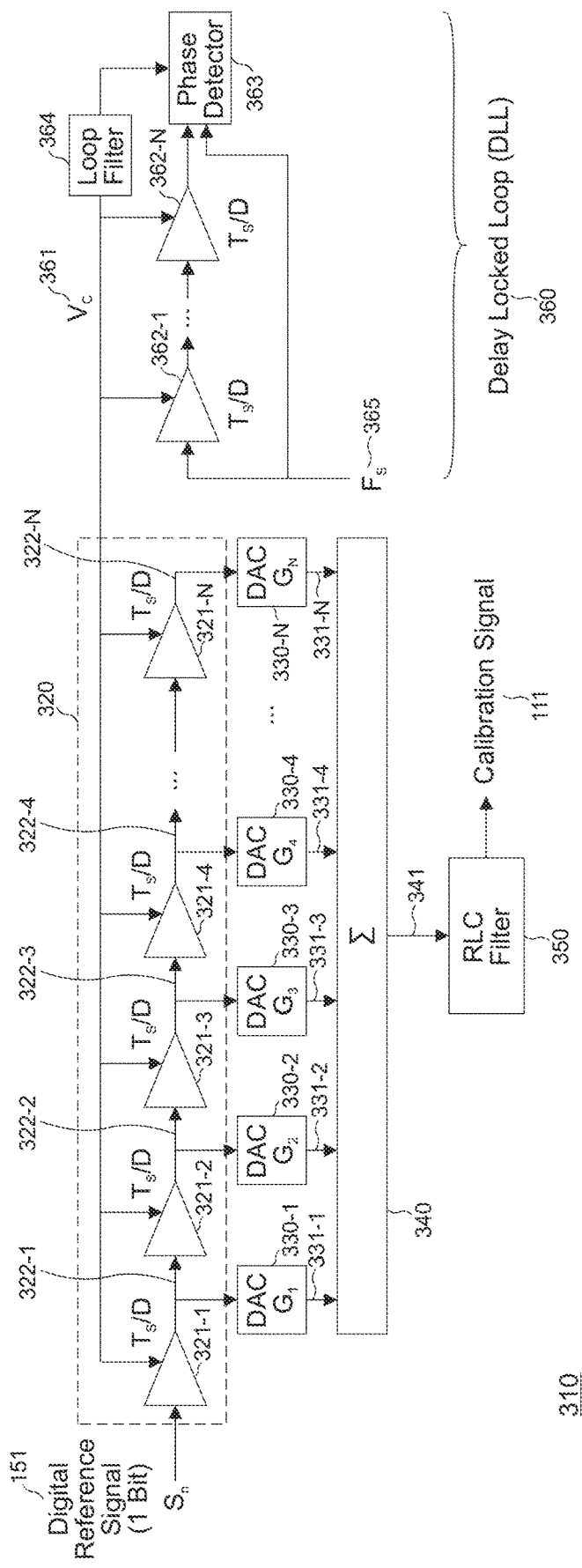

Another more sophisticated example of an analog signal generation circuit 310 is illustrated in FIG. 3. The analog signal generation circuit 310 comprises delay circuit 320 configured to iteratively delay a digital data sequence $s_n$ represented by the digital calibration signal 151 for generating a plurality of delayed digital data sequences 322-1, . . . , 322-N (a 1 bit sequence is used). In the example of FIG. 3, the delay circuit 310 comprises a chain of delay elements 321-1, . . . , 321-N configured to iteratively delay the digital data sequence $s_n$. A delay time by which each of the delay elements 321-1, . . . , 321-N delays its input is based on a control signal 361. A Delay-Locked Loop (DLL) 360 is configured to supply the control signal 361 to the delay elements 321-1, . . . , 321-N.

A reference clock signal 365 exhibiting a frequency $F_S$ equal to a data rate of the digital calibration signal 151 is iteratively delayed by a chain of delay elements 362-1, . . . , 362-N of the DLL 360. The phase of the output of the last delay element 362-N of the chain is compared to the phase of the reference clock signal 365 by means of a phase detector circuit 363. Based on the phase difference between the output of the last delay element 362-N and the reference clock signal 365, a phase error signal is generated and filtered by means of a loop filter 364 of the DLL. The output of the loop filter is the control signal 361 for the delay elements 321-1, . . . , 321-N of the delay circuit 320. For example, the control signal 361 may be a control voltage for adjusting the delay times of the delay elements 321-1, ..., 321-N. Also the delay times of the delay elements 362-1, ..., 362-N of the DLL 360 are controlled by the control signal 361. For example, the delay elements 321-1, ..., 321-N and 362-1, ..., 362-N may be inverter circuits.

The delay time τ of the delay elements 321-1, ..., 321-N and 362-1, ..., 362-N is defined as follows in the example of FIG. 3:

$$\tau = \frac{T_s}{D}, \qquad (1)$$

with $1/T_s$ denoting a data rate of the digital calibration signal 151, and D denoting a desired oversampling ratio for the digital calibration signal 151. In other words, the digital calibration signal 151 is oversampled D times. The number N of delay elements may, in general, be equal to or greater than the desired oversampling ratio D. In the example of FIG. 3, the number N of delay elements is chosen greater than desired oversampling ratio D.

It is to be noted that the data rate of the digital calibration signal 151 may be equal to or different from a value of the (maximum) sample rate of the TI-ADC to be calibrated.

In other words, the digital calibration signal 151 (i.e. the digital input to the analog signal generation circuit 310) is passed through a delay line with a unit delay $T_s/D$. The delays are generated using, e.g., a chain of inverters with controlled delay, wherein the control voltage is derived from a DLL using similar delay elements.

Further, the analog signal generation circuit 310 comprises a plurality of DACs 330-1, ..., 330-N each configured to generate a respective analog signal 331-1, ..., 331-N based on one of the plurality of delayed digital data sequences 322-1, ..., 322-N. In the example of FIG. 3, the DACs 330-1, ..., 330-N exhibit a resolution of 1 bit and generate the analog signals 331-1, ..., 331-N with different gains (weights). For example, the DAC 330-1 generates the analog signal 331-1 based on the delayed digital data sequence 322-1 using a first gain (weight) $G_1$, whereas the DAC 330-2 generates the analog signal 331-2 based on the delayed digital data sequence 322-2 using a second gain (weight) $G_2$.

The plurality of DACs 330-1, ..., 330-N are coupled to a combiner 340 configured to combine the analog signals 331-1, ..., 331-N generated by the plurality of DACs 330-1, ..., 330-N to an auxiliary analog signal 341. A passive analog filter 350 (e.g. an RLC filter) is coupled to the combiner 340 and configured to generate the analog calibration signal 111 by filtering the auxiliary analog signal 341.

In other words, a set of 1 bit DACs with different weights ($G_i$, I=1 ... N) are connected (coupled) to the outputs of the delay elements, added together and passed through a passive analog filter. The combination of the delay circuit 320 and the plurality of DACs 330-1, ..., 330-N forms an analog discrete-time FIR filter at an oversampled rate $D/T_s$. This configuration may be advantageous since the 1 bit DACs are inherently linear (provided that the rise and fall times of the digital input are equal). Further, the passive analog filter 350 (e.g. an RLC filter) is also inherently linear. Any imperfections in the implementation of the unit delay $T_S/D$ and the gains $G_i$ are linear effects. Due to the use of oversampling and FIR filtering, the analog passive filter implementation may be simplified.

In alternative examples, the delay line may be retimed after every D delays since the output of the delay line after K·D delay elements is the digital data sequence $s_{n-K}$ (K≥1). Applied to the example of FIG. 3, the delay circuit 320 would be configured to iteratively delay the digital data sequence $s_n$, represented by the digital calibration signal 151 D times in order to generate D delayed digital data sequences 322-1, ..., 322-D. The plurality of DACs 331-1, ..., 331-D would process the delayed digital data sequences as described above. In addition, the analog signal generation circuit would comprise K further sets of delay circuits and DACs for generating further analog signals based on further digital data sequences $s_{n-1}$, ..., $s_{n-K}$ represented by the digital calibration signal 151. For example, the analog signal generation circuit may additionally comprise a second delay circuit configured to iteratively delay a second digital data sequence $s_{n-1}$ represented by the digital calibration signal 151 for generating a plurality of delayed second digital data sequences (similarly to what is described above for the digital data sequence $s_n$). Further, the analog signal generation circuit may additionally comprise a second plurality of DACs each configured to generate a respective second analog signal based on one of the plurality of delayed second digital data sequences (similarly to what is described above). The combiner 340 may then combine the analog signals generated by the plurality of DACs 331-1, ..., 331-D and the second analog signals generated by the second plurality of DACs to the auxiliary analog signal 341.

The second delay circuit and the second plurality of DACs may be implemented and configured substantially similar to what is described above for the delay circuit 320 and the plurality of DACs 330-1, ..., 330-N. For example, the second plurality of DACs may be configured to generate the second analog signals with different gains. The delay circuit 320 and the second delay circuit may, e.g., be configured to iteratively delay the digital data sequence $s_n$ and the second digital data sequence $s_{n-1}$ by the same delay time τ. The delay times of the delay circuit 320 and the second delay circuit may, e.g., be controlled by the same DLL.

Figure 4:
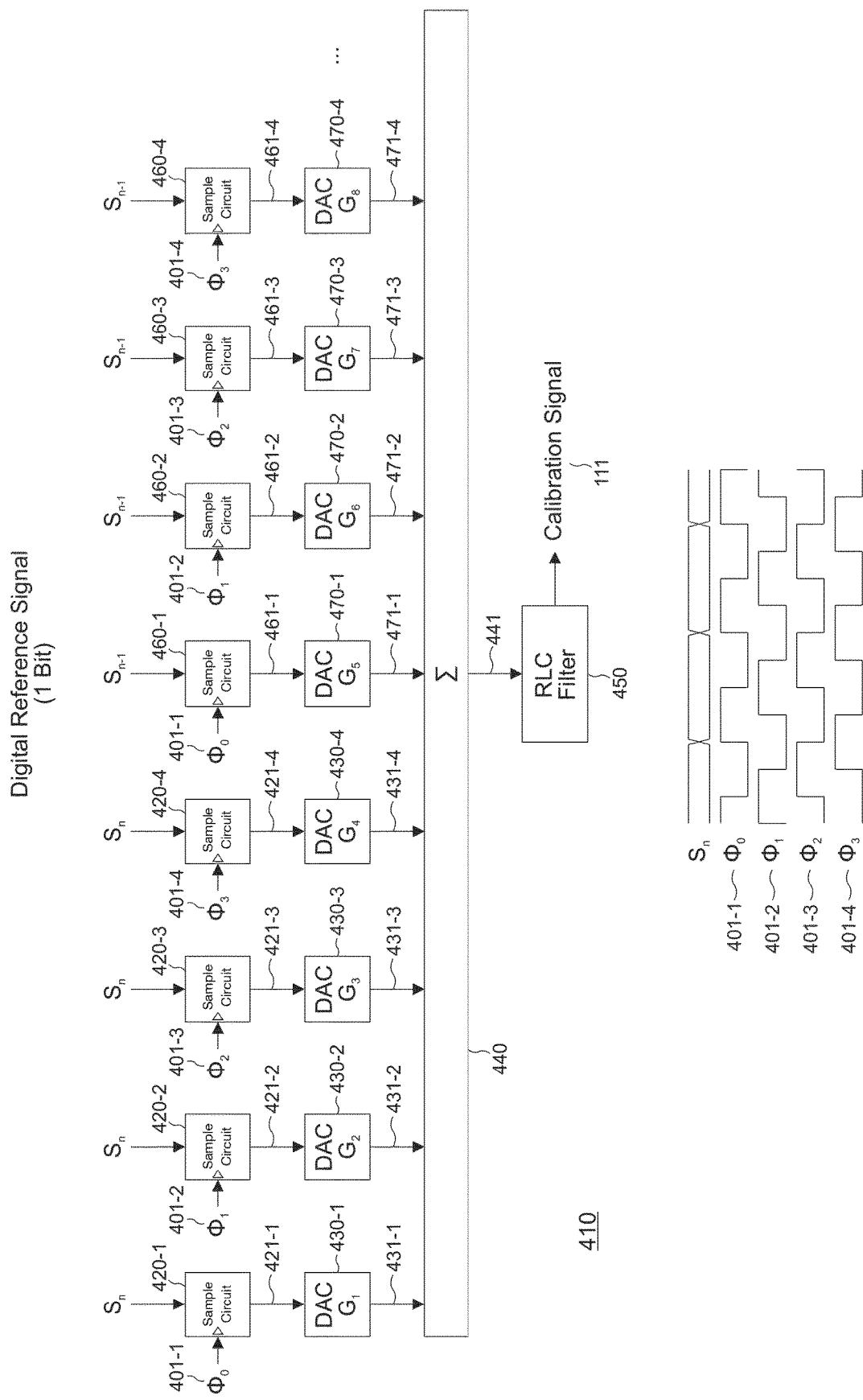

An alternative analog signal generation circuit 410 is illustrated in FIG. 4. The analog signal generation circuit 410 uses flip-flops as sample circuits instead of an inverter delay line. In the example of FIG. 4, an exemplary analog signal generation circuit for an oversampling ratio of D=4 is illustrated. However, it is to be noted that the oversampling ratio of D=4 is selected for illustrative purposes only and the proposed architecture is not limited to this specific oversampling ratio.

The analog signal generation circuit 410 comprises a plurality of sample circuits 420-1, ..., 420-4 configured to generate a plurality of sampled signals 421-1, ..., 421-4 by sampling a digital data sequence $s_n$ represented by the digital calibration signal 151 based on different ones of a plurality of phase shifted clock signals 401-1, ..., 401-4. The number N of sample circuits is equal to the oversampling ratio D. An exemplary signal course for the digital data sequence $s_n$ is illustrated in the lower part of FIG. 4 together with four exemplary signal courses for the phase shifted clock signals 401-1, ..., 401-4. Since the oversampling ratio D=4, the clock signals 401-1, ..., 401-4 are phase shifted by 360°/4=90° with respect to each other.

Further, the analog signal generation circuit 410 comprises a plurality of DACs 430-1, ..., 430-4 each configured to generate a respective analog signal 431-1, ..., 431-4 based on one of the plurality of sampled signals 421-1, ..., 421-4. In the example of FIG. 4, the DACs 430-1, ..., 430-4 exhibit a resolution of 1 bit and generate the analog signals 431-1, ..., 431-4 with different gains (weights). For example, the DAC 430-1 generates the analog signal 431-1 based on the sampled signal 421-1 using a first gain (weight) $G_1$, whereas the DAC 430-2 generates the analog signal 431-2 based on the sampled signal 421-2 using a second gain (weight) $G_2$.

The plurality of DACs 430-1, ..., 430-4 are coupled to a combiner 440 configured to combine the analog signals 431-1, ..., 431-4 generated by the plurality of DACs 430-1, ..., 430-4 to an auxiliary analog signal 441. A passive analog filter 450 (e.g. an RLC filter) is coupled to the combiner 440 and configured to generate the analog calibration signal 111 by filtering the auxiliary analog signal 441.

For the K−1 further digital data sequences $s_{n-1}, \ldots, s_{n-K}$ represented by the digital calibration signal 151 (K≥1), the analog signal generation circuit 410 comprises K−1 further sets of sample circuits and DACs for generating further analog signals. For example, the analog signal generation circuit 410 comprises a second plurality of sample circuits 460-1, ..., 460-4 configured to generate a second plurality of sampled signals 461-1, ..., 461-4 by sampling a second digital data sequence $s_{n-1}$ represented by the digital calibration signal 151 based on different ones of the plurality of phase shifted clock signals 401-1, ..., 401-4. Further, the analog signal generation circuit 410 additionally comprises a second plurality of DACs 470-1, ..., 470-4 each configured to generate a respective second analog signal 471-1, ..., 471-4 based on one of the second plurality of sampled signals 461-1, ..., 461-4.

The combiner 440 is configured to combine the analog signals 431-1, ..., 431-4 generated by the plurality of DACs 430-1, ..., 430-4 and the second analog signals 471-1, ..., 471-4 generated by the second plurality of DACs 470-1, ..., 470-4 to the auxiliary analog signal 441.

The second plurality of sample circuits 460-1, ..., 460-4 and the second plurality of DACs 470-1, ..., 470-4 may be implemented and configured substantially similar to what is described above for the plurality of sample circuits 420-1, ..., 420-4 and the plurality of DACs 430-1, ..., 430-4. For example, the second plurality of DACs 430-1, ..., 430-4 may be configured to generate the second analog signals with different gains.

The DACs of the analog signal generation circuit 410 may again exhibit a resolution of 1 bit so that the DACs are inherently linear. Further, the digital data sequences $s_n, \ldots, s_{n-K}$ represented by the digital calibration signal 151 may be 1 bit sequences.

The combination of the sample circuits and the DACs forms an analog discrete-time FIR filter at an oversampled rate $D/T_S$. The implementation of the analog passive filter implementation may, hence, again be simplified due to the use of oversampling and FIR filtering.

Figure 5:
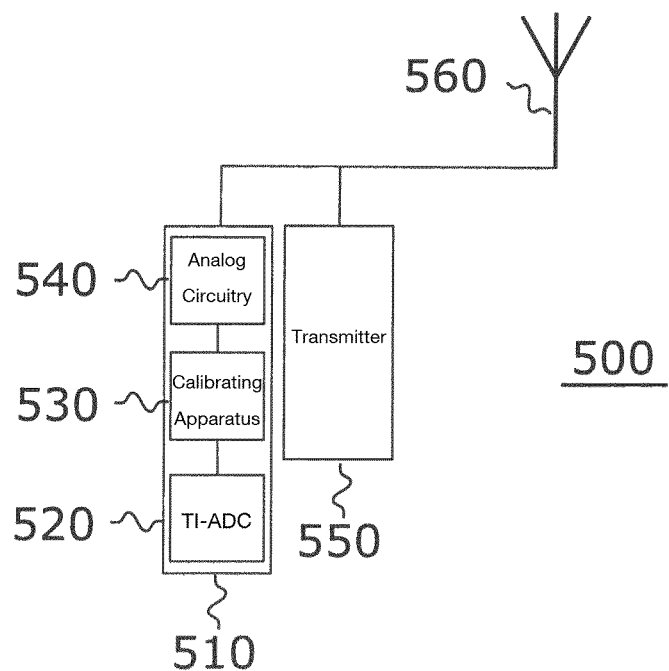
FIG. 5 illustrates an example of a base station.

An example of an implementation using ADC calibration according to one or more aspects of the architecture(s) described above or one or more examples described above is illustrated in FIG. 5. FIG. 5 schematically illustrates an example of a radio base station 500 (e.g. for a femtocell, a picocell, a microcell or a macrocell) comprising an apparatus 530 for calibrating a TI-ADC 520 as proposed.

The TI-ADC 520 and the apparatus 530 for calibrating the TI-ADC 520 are part of a receiver 510. The receiver 510 additionally comprises analog circuitry 540 configured to receive a RF receive signal from an antenna element 560 of the base station 500. The analog circuitry 540 is further configured to supply the analog signal for digitization to the signal node of the apparatus 530 based on the RF receive signal. For example, the analog circuitry 540 may comprise one or more of a filter, a down-converter (mixer) or a Low Noise Amplifier (LNA).

Further, the base station 500 comprises a transmitter 550 configured to generate a RF transmit signal. The transmitter 550 may use the antenna element 560 or another antenna element (not illustrated) of the base station 500 for radiating the RF transmit signal to the environment.

To this end, a base station enabling improved offline calibration of the TI-ADC may be provided. Accordingly, a performance of the TI-ADC and, hence, the base station may be improved.

The base station 500 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 6:
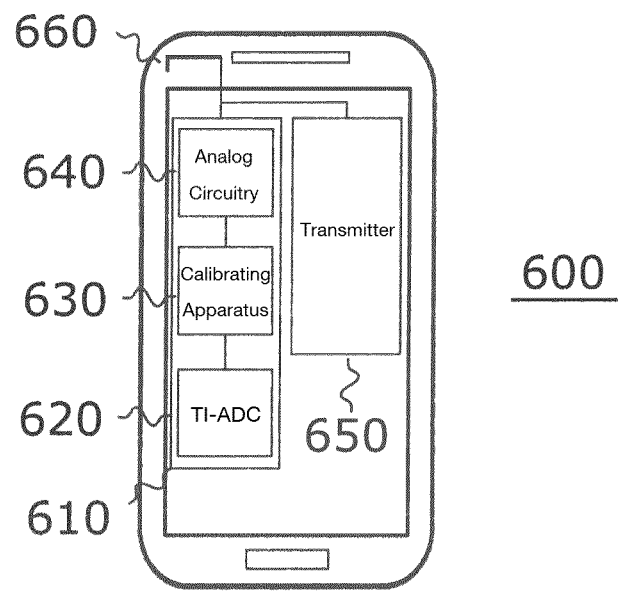
FIG. 6 illustrates an example of a mobile device.

Another example of an implementation using ADC calibration according to one or more aspects of the architecture(s) described above or one or more examples described above is illustrated in FIG. 6. FIG. 6 schematically illustrates an example of a mobile device 600 (e.g. mobile phone, smartphone, tablet-computer, or laptop) comprising an apparatus 630 for calibrating a TI-ADC 620 as proposed.

The TI-ADC 620 and the apparatus 630 for calibrating the TI-ADC 620 are part of a receiver 610. The receiver 610 additionally comprises analog circuitry 640 configured to receive a RF receive signal from an antenna element 660 of the mobile device 600. The analog circuitry 640 is further configured to supply the analog signal for digitization to the signal node of the apparatus 630 based on the RF receive signal. For example, the analog circuitry 640 may comprise one or more of a filter, a down-converter (mixer) or a LNA.

Further, the mobile device 600 comprises a transmitter 650 configured to generate a RF transmit signal. The transmitter 650 may use the antenna element 660 or another antenna element (not illustrated) of the mobile device 600 for radiating the RF transmit signal to the environment.

To this end, a mobile device enabling improved offline calibration of the ADC may be provided. Accordingly, a performance of the ADC and, hence, the mobile device may be improved.

The mobile device 600 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using TI-ADC calibration according to the proposed architecture or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is an apparatus for calibrating a TI-ADC comprising a plurality of time-interleaved ADC circuits, the apparatus comprising: an analog signal generation circuit configured to generate an analog calibration signal based on a digital calibration signal representing one or more digital data sequences for calibration, wherein the analog calibration signal is a wideband signal; and a coupling circuit configured to controllably couple an input node of the TI-ADC to either the analog signal generation circuit or to a node capable of providing an analog signal for digitization.

Example 2 is the apparatus of example 1, wherein the coupling circuit is configured to controllably couple the input node of the TI-ADC to either the analog signal generation circuit or to the signal node based on a control signal indicative of a desired operation mode of the TI-ADC.

Example 3 is the apparatus of example 1 or example 2, wherein a bandwidth of the analog calibration signal is less than half of a maximum value of the sample rate of the TI-ADC.

Example 4 is the apparatus of any of examples 1 to 3, wherein amplitude values of the analog calibration signal cover all input amplitude values supported by the TI-ADC.

Example 5 is the apparatus of any of examples 1 to 5, wherein a linearity of the analog signal generation circuit is higher than a desired linearity of the TI-ADC.

Example 6 is the apparatus of any of examples 1 to 5, wherein the analog signal generation circuit comprises: a DAC configured to generate an analog signal based on the digital calibration signal; and an analog filter configured to generate the analog calibration signal by filtering the analog signal.

Example 7 is the apparatus of example 6, wherein the analog filter comprises: an analog finite impulse response filter configured to generate an auxiliary analog signal by filtering the analog signal; and a passive analog filter coupled to the analog finite impulse response filter and configured to generate the analog calibration signal by filtering the auxiliary analog signal.

Example 8 is the apparatus of example 6 or example 7, wherein the DAC exhibits a resolution of 1 bit.

Example 9 is the apparatus of any of examples 1 to 5, wherein the analog signal generation circuit comprises: delay circuit configured to iteratively delay a digital data sequence represented by the digital calibration signal for generating a plurality of delayed digital data sequences; a plurality of DACs each configured to generate a respective analog signal based on one of the plurality of delayed digital data sequences; a combiner configured to combine the analog signals generated by the plurality of DACs to an auxiliary analog signal; and a passive analog filter coupled to the combiner and configured to generate the analog calibration signal by filtering the auxiliary analog signal.

Example 10 is the apparatus of example 9, wherein the plurality of DACs are configured to generate the analog signals with different gains.

Example 11 is the apparatus of example 9 or example 10, wherein the delay circuit is configured to iteratively delay the digital data sequence by a delay time, and wherein the delay time τ is defined as follows:

$$\tau = \frac{T_s}{D},$$

with $1/T_s$ denoting a data rate of the digital calibration signal, and D denoting a desired oversampling ratio for the digital calibration signal.

Example 12 is the apparatus of any of examples 9 to 11, wherein the delay circuit comprises a chain of delay elements configured to iteratively delay the digital data sequence, wherein a delay time by which each of the delay elements delays its input is based on a control signal, and wherein the apparatus further comprises a DLL configured to supply the control signal to the delay elements.

Example 13 is the apparatus of any of examples 9 to 12, wherein the analog signal generation circuit comprises: a second delay circuit configured to iteratively delay a second digital data sequence represented by the digital calibration signal for generating a plurality of delayed second digital data sequences; and a second plurality of DACs each configured to generate a respective second analog signal based on one of the plurality of delayed second digital data sequences, wherein the combiner is configured to combine the analog signals generated by the plurality of DACs and the second analog signals generated by the second plurality of DACs to the auxiliary analog signal.

Example 14 is the apparatus of example 13, wherein the second plurality of DACs are configured to generate the second analog signals with different gains.

Example 15 is the apparatus of example 13 or example 14, wherein the delay circuit and the second delay circuit are configured to iteratively delay the digital data sequence and the second digital data sequence by the same delay time.

Example 16 is the apparatus of any of examples 1 to 5, wherein the analog signal generation circuit comprises: a plurality of sample circuits configured to generate a plurality of sampled signals by sampling a digital data sequence represented by the digital calibration signal based on different ones of a plurality of phase shifted clock signals; a plurality of DACs each configured to generate a respective analog signal based on one of the plurality of sampled signals; a combiner configured to combine the analog signals generated by the plurality of DACs to an auxiliary analog signal; and a passive analog filter coupled to the combiner and configured to generate the analog calibration signal by filtering the auxiliary analog signal.

Example 17 is the apparatus of example 16, wherein the plurality of DACs are configured to generate the analog signals with different gains.

Example 18 is the apparatus of example 16 or example 17, wherein the number of sample circuits is equal to a desired oversampling ratio for the digital calibration signal.

Example 19 is the apparatus of any of examples 16 to 18, wherein the analog signal generation circuit further comprises: a second plurality of sample circuits configured to generate a second plurality of sampled signals by sampling a second digital data sequence represented by the digital calibration signal based on different ones of the plurality of phase shifted clock signals; a second plurality of DACs each configured to generate a respective second analog signal based on one of the second plurality of sampled signals, wherein the combiner is configured to combine the analog signals generated by the plurality of DACs and the second analog signals generated by the second plurality of DACs to the auxiliary analog signal.

Example 20 is the apparatus of example 19, wherein the second plurality of DACs are configured to generate the second analog signals with different gains.

Example 21 is the apparatus of any of examples 9 to 20, wherein the plurality of DACs exhibits a resolution of 1 bit.

Example 22 is the apparatus of any of examples 1 to 21, wherein the one or more digital data sequences represented by the digital calibration signal are 1 bit sequences.

Example 23 is a receiver, comprising: a TI-ADC; and an apparatus for calibrating the TI-ADC according to any of examples 1 to 22.

Example 24 is the receiver of example 23, further comprising: analog circuitry configured to receive a RF receive signal from an antenna element, and to supply the analog signal for digitization to the signal node based on the RF receive signal.

Example 25 is a base station, comprising: a receiver according to example 23 or example 24; and a transmitter configured to generate a RF transmit signal.

Example 26 is the base station of example 25, further comprising at least one antenna element coupled to at least one of the receiver and the transmitter.

Example 27 is a mobile device, comprising: a receiver according to example 23 or example 24; and a transmitter configured to generate a RF transmit signal.

Example 28 is the mobile device of example 27, further comprising at least one antenna element coupled to at least one of the receiver and the transmitter.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include DSP hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for calibrating a time-interleaved analog-to-digital converter comprising a plurality of time-interleaved analog-to-digital converter circuits, the apparatus comprising:
    an analog signal generation circuit configured to generate an analog calibration signal based on a digital calibration signal representing one or more digital data sequences for calibration, wherein the analog calibration signal is a wideband signal; and
    a coupling circuit configured to operably couple an input node of the time-interleaved analog-to-digital converter to either the analog signal generation circuit or to a node configured to provide an analog signal for digitization.

2. The apparatus of claim 1, wherein the coupling circuit is configured to controllably couple the input node of the time-interleaved analog-to-digital converter to either the analog signal generation circuit or to the signal node based on a control signal indicative of a redetermined operation mode of the time-interleaved analog-to-digital converter.

3. The apparatus of claim 1, wherein a bandwidth of the analog calibration signal is less than half of a maximum value of the sample rate of the time-interleaved analog-to-digital converter.

4. The apparatus of claim 1, wherein amplitude values of the analog calibration signal cover all input amplitude values supported by the time-interleaved analog-to-digital converter.

5. The apparatus of claim 1, wherein a linearity of the analog signal generation circuit is higher than a desired linearity of the time-interleaved analog-to-digital converter.

6. The apparatus of claim 1, wherein the analog signal generation circuit comprises:
    a digital-to-analog converter configured to generate an analog signal based on the digital calibration signal; and
    an analog filter configured to generate the analog calibration signal by filtering the analog signal.

7. The apparatus of claim 6, wherein the analog filter comprises:
    an analog finite impulse response filter configured to generate an auxiliary analog signal by filtering the analog signal; and
    a passive analog filter coupled to the analog finite impulse response filter and configured to generate the analog calibration signal by filtering the auxiliary analog signal.

8. The apparatus of claim 6, wherein the digital-to-analog converter exhibits a resolution of 1 bit.

9. The apparatus of claim 1, wherein the analog signal generation circuit comprises:
    delay circuit configured to iteratively delay a digital data sequence represented by the digital calibration signal for generating a plurality of delayed digital data sequences;
    a plurality of digital-to-analog converters each configured to generate a respective analog signal based on one of the plurality of delayed digital data sequences;

a combiner configured to combine the analog signals generated by the plurality of digital-to-analog converters to an auxiliary analog signal; and a passive analog filter coupled to the combiner and configured to generate the analog calibration signal by filtering the auxiliary analog signal.

10. The apparatus of claim 9, wherein the plurality of digital-to-analog converters are configured to generate the analog signals with different gains.

11. The apparatus of claim 9, wherein the delay circuit is configured to iteratively delay the digital data sequence by a delay time, and wherein the delay time τ is defined as follows:

$$\tau = \frac{T_s}{D},$$

with $1/T_s$ denoting a data rate of the digital calibration signal, and D denoting a desired oversampling ratio for the digital calibration signal.

12. The apparatus of claim 9, wherein the delay circuit comprises a chain of delay elements configured to iteratively delay the digital data sequence, wherein a delay time by which each of the delay elements delays its input is based on a control signal, and wherein the apparatus further comprises a delay-locked loop configured to supply the control signal to the delay elements.

13. The apparatus of claim 9, wherein the analog signal generation circuit comprises:
a second delay circuit configured to iteratively delay a second digital data sequence represented by the digital calibration signal for generating a plurality of delayed second digital data sequences; and
a second plurality of digital-to-analog converters each configured to generate a respective second analog signal based on one of the plurality of delayed second digital data sequences,
wherein the combiner is configured to combine the analog signals generated by the plurality of digital-to-analog converters and the second analog signals generated by the second plurality of digital-to-analog converters to the auxiliary analog signal.

14. The apparatus of claim 13, wherein the second plurality of digital-to-analog converters are configured to generate the second analog signals with different gains.

15. The apparatus of claim 13, wherein the delay circuit and the second delay circuit are configured to iteratively delay the digital data sequence and the second digital data sequence by the same delay time.

16. The apparatus of claim 9, wherein the plurality of digital-to-analog converters exhibits a resolution of 1 bit.

17. The apparatus of claim 1, wherein the analog signal generation circuit comprises:
a plurality of sample circuits configured to generate a plurality of sampled signals by sampling a digital data sequence represented by the digital calibration signal based on different ones of a plurality of phase shifted clock signals;
a plurality of digital-to-analog converters each configured to generate a respective analog signal based on one of the plurality of sampled signals;
a combiner configured to combine the analog signals generated by the plurality of digital-to-analog converters to an auxiliary analog signal; and
a passive analog filter coupled to the combiner and configured to generate the analog calibration signal by filtering the auxiliary analog signal.

18. The apparatus of claim 17, wherein the plurality of digital-to-analog converters are configured to generate the analog signals with different gains.

19. The apparatus of claim 17, wherein the number of sample circuits is equal to a desired oversampling ratio for the digital calibration signal.

20. The apparatus of claim 17, wherein the analog signal generation circuit further comprises:
a second plurality of sample circuits configured to generate a second plurality of sampled signals by sampling a second digital data sequence represented by the digital calibration signal based on different ones of the plurality of phase shifted clock signals;
a second plurality of digital-to-analog converters each configured to generate a respective second analog signal based on one of the second plurality of sampled signals,
wherein the combiner is configured to combine the analog signals generated by the plurality of digital-to-analog converters and the second analog signals generated by the second plurality of digital-to-analog converters to the auxiliary analog signal.

21. The apparatus of claim 20, wherein the second plurality of digital-to-analog converters are configured to generate the second analog signals with different gains.

22. The apparatus of claim 1, wherein the one or more digital data sequences represented by the digital calibration signal are 1 bit sequences.

23. A receiver, comprising:
an time-interleaved analog-to-digital converter; and
an apparatus for calibrating the time-interleaved analog-to-digital converter according to claim 1.

24. The receiver of claim 23, further comprising:
analog circuitry configured to receive a radio frequency receive signal from an antenna element, and to supply the analog signal for digitization to the signal node based on the radio frequency receive signal.

25. A base station, comprising:
a receiver according to claim 23; and
a transmitter configured to generate a radio frequency transmit signal.

* * * * *